US006276945B1

(12) United States Patent
Hayward et al.

(10) Patent No.: US 6,276,945 B1
(45) Date of Patent: Aug. 21, 2001

(54) CONNECTORS HAVING A FOLDED-PATH GEOMETRY FOR IMPROVED CROSSTALK AND SIGNAL TRANSMISSION CHARACTERISTICS

(75) Inventors: C. Michael Hayward, Harvard; Richard N. Rehlander, Billerica, both of MA (US)

(73) Assignee: Hybricon Corporation

( * ) Notice: Subject to any disclaimer, the term of this patent is extended or adjusted under 35 U.S.C. 154(b) by 0 days.

(21) Appl. No.: 09/269,451

(22) PCT Filed: Jul. 29, 1998

(86) PCT No.: PCT/US98/15661

§ 371 Date: Nov. 23, 1999

§ 102(e) Date: Nov. 23, 1999

(87) PCT Pub. No.: WO99/07036

PCT Pub. Date: Feb. 11, 1999

Related U.S. Application Data

(63) Continuation-in-part of application No. 08/902,590, filed on Jul. 29, 1997.

(51) Int. Cl.[7] .............................. H01R 12/00; H05K 1/00

(52) U.S. Cl. .............................................................. 439/82

(58) Field of Search .............................. 439/82, 853, 857, 439/79, 80, 941, 83, 931, 607

(56) References Cited

U.S. PATENT DOCUMENTS

| | | | |
|---|---|---|---|
| 1,743,492 | 1/1930 | Sipe . | |
| 2,754,716 | 7/1956 | Bourns | 85/8.3 |
| 2,977,562 * | 3/1961 | Benson . | |
| 3,614,707 | 10/1971 | Kaufmann et al. | 439/59 |
| 3,793,614 | 2/1974 | Tachick et al. | 439/88 |
| 3,913,444 | 10/1975 | Otte | 85/8.3 |
| 4,731,031 | 3/1988 | Lemke | 439/76 |
| 4,797,110 | 1/1989 | Ponziani et al. | 439/83 |
| 4,806,107 | 2/1989 | Arnold et al. | 439/79 |
| 4,911,643 | 3/1990 | Perry et al. | 439/67 |
| 4,917,616 | 4/1990 | Demler, Jr. et al. | 439/101 |
| 4,975,084 | 12/1990 | Fedder et al. | 439/608 |
| 5,024,609 | 6/1991 | Piorunneck | 439/637 |
| 5,024,627 | 6/1991 | Bennett et al. | 439/631 |
| 5,066,236 | 11/1991 | Broeksteeg | 439/79 |
| 5,086,372 | 2/1992 | Bennett et al. | 361/415 |
| 5,104,341 | 4/1992 | Gilissen et al. | 439/608 |
| 5,161,986 | 11/1992 | Gulbranson et al. | 439/92 |

(List continued on next page.)

OTHER PUBLICATIONS

D. W. Skinner, "Electrical Connector", IBM Technical Disclosure Bulletin, vol. 12, No. 3, p. 467, (8/69).

*Primary Examiner*—Khiem Nguyen
*Assistant Examiner*—Javaid Nasri
(74) *Attorney, Agent, or Firm*—Mills & Onello LLP

(57) ABSTRACT

In an improved connector assembly, a male pin (112) is inserted into a proximal end of a female contact which (110) conductivity engages the pin at a distal end, providing a folded signal path geometry. As a signal propagates in a first direction alone the male pin (112), it generates a first magnetic field of a first orientation about the male pin (112). At the contact point, the signal reverses direction and generates a second magnetic field of a second orientation opposite the first orientation about the female contact (110). Their respective opposed orientations cause the magnetic fields to substantially cancel in the region of magnetic interaction. Any remaining electronic fields are contained by grounded shielding in the female contact (110) cavities, for example in the form of chambers with conductivity coated walls surrounding the contacts. This configuration mitigates the effect of crosstalk between adjacent signals in the connector, and reduces the effective path length of the signal.

43 Claims, 12 Drawing Sheets

U.S. PATENT DOCUMENTS

| | | | |
|---|---|---|---|
| 5,171,154 | 12/1992 | Casciotti et al. | 439/67 |
| 5,239,125 | 8/1993 | Savage et al. | 174/35 MS |
| 5,239,748 | 8/1993 | Hamilton | 29/843 |
| 5,266,036 | 11/1993 | Lichtenwalter et al. | 439/65 |
| 5,277,624 | 1/1994 | Champion et al. | 439/607 |
| 5,309,630 | 5/1994 | Brunker et al. | 29/842 |
| 5,344,341 | 9/1994 | Yoshino | 439/607 |
| 5,399,104 | 3/1995 | Middlehurst et al. | 439/608 |
| 5,399,107 | 3/1995 | Gentry et al. | 439/676 |
| 5,433,616 | 7/1995 | Walden | 439/62 |
| 5,466,162 | 11/1995 | Schroepfer et al. | 439/79 |
| 5,469,335 | 11/1995 | Kluth et al. | 361/800 |
| 5,496,183 | 3/1996 | Soes et al. | 439/79 |
| 5,507,651 | 4/1996 | Tanaka et al. | 439/67 |
| 5,509,823 | 4/1996 | Harting et al. | 439/607 |
| 5,556,296 | 9/1996 | Dussausse et al. | 439/404 |
| 5,564,948 | 10/1996 | Harting et al. | 439/607 |
| 5,600,544 | 2/1997 | Thalhammer | 361/816 |
| 5,614,694 | 3/1997 | Gorenz, Jr. et al. | 174/35 R |
| 5,616,035 | 4/1997 | Shu | 439/79 |
| 5,709,557 | 1/1998 | Martin et al. | 439/79 |
| 5,772,453 | 6/1998 | Tan et al. . | |

* cited by examiner

FIG. 2 PRIOR ART
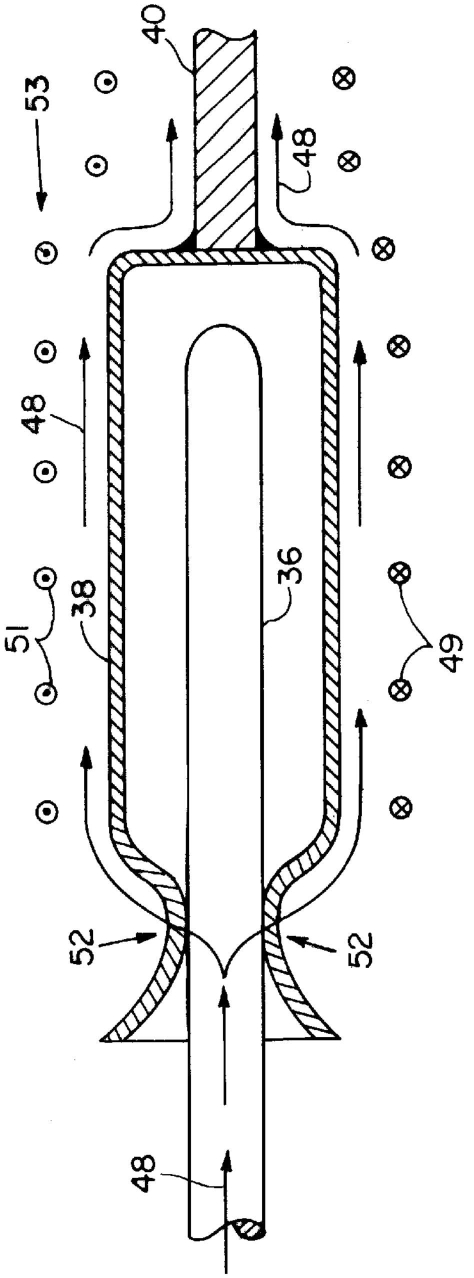
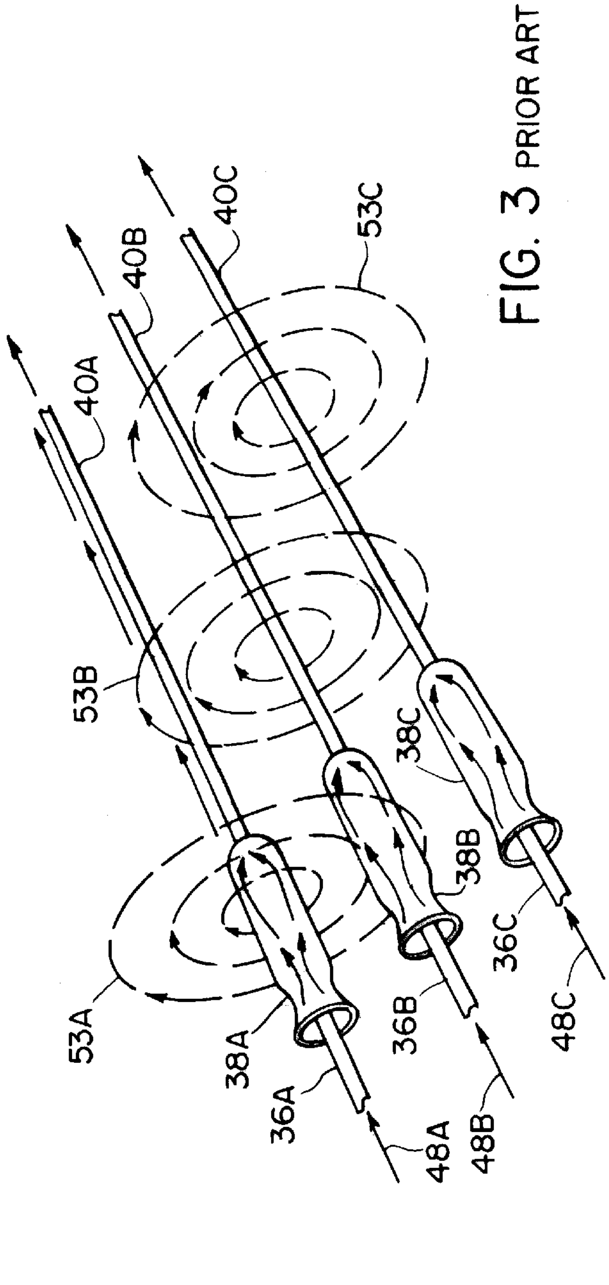
FIG. 3 PRIOR ART

CONNECTORS HAVING A FOLDED-PATH GEOMETRY FOR IMPROVED CROSSTALK AND SIGNAL TRANSMISSION CHARACTERISTICS

This application is a Continuation-In-Part application of U.S. application Ser. No. 08/902,590, filed Jul. 29, 1997, the contents of which are incorporated herein by reference.

BACKGROUND OF THE INVENTION

Modern backplanes, also referred to as motherboards, serve as communication media for the exchange of electronic signals between a plurality of daughter cards. The daughter cards generate communication signals, for example, data signals, address signals, and control signals which are distributed to daughter card connectors mounted on one or both sides of each daughter card. The daughter card connectors register with a corresponding set of backplane connectors on the backplane, which in turn distributes the signals between daughter cards along various communication paths.

Each connector pair includes an array of conductive interconnects in the form of mating male pins and female contacts which couple by frictional contact. The interconnects each provide a separate electrical path for the transmission of signals between, boards typically with some providing the transmission of signals in one direction and the others providing the transmission of signals in the other direction. Within a connector, the interconnect paths run substantially parallel.

As communication technology improves, there is increasing demand on connectors to channel more data through a given area. An obvious solution is to reduce the distance between signal paths, allowing for more data channels. This, however, increases the likelihood of electromagnetic coupling between signals. Such coupling generally takes on two forms, namely electric field E (capacitive) coupling and magnetic field H (inductive) coupling. The influence of either form of coupling between signals is generally referred to in the art as crosstalk. Crosstalk corrupts the waveform of an affected signal, which, in turn, can cause data errors, timing errors or other anomalies which interfere with proper data communication.

The danger of crosstalk is most significant where signals converge in a densely-populated region as in a connector. This passage of signals through connector pins in close proximity to each other makes crosstalk inevitable in prior art connector configurations, for example the configuration shown in the perspective view of Prior Art FIG. 1A and the side view of Prior Art FIG. 1B. This configuration includes a male connector housing 30 having an array of male pins 36 mounted to a, backplane 32 and a corresponding female connector housing 34 having a corresponding array of female contacts 38 bonded to a printed circuit board daughter card 42. The female contacts 38 connect to the printed circuit board 42 by metal rods 40 which are bent approximately at right angles 44 contacting the printed wiring through plated through-holes 46 or surface mount pads.

Such an arrangement is sufficient for transporting signals of moderate speeds. However, in modern systems having faster signal clocks and increased data throughput, crosstalk interferes with system performance. In particular, the length of the paths between the backplane 32 and the daughter card 42 and the coupling between them introduces delays, distortions and unwanted couplings which seriously degrade the information transmitted.

Prior Art FIG. 1B illustrates the path of a signal, represented by arrow 48, propagating between a backplane 32 and a daughter card 42 through a prior art connector assembly 30, 34. It is apparent that the path length of the conductive medium between boards, including male pin 36A, female contact 38A and metal rod 40A, is extended and linear. It is also apparent that this path is parallel to adjacent paths defined by male pin 46B, female contact 38B and metal rod 40B over its entire length. The behavior of the signal current 48 and its responsibility in inducing crosstalk are illustrated in Prior Art FIG. 2 and FIG. 3.

Prior Art FIG. 2 illustrates signal current 48 propagating through a male pin 36, entering a female contact 38 at contact point 52 and passing to conducting rod 40. As the signal propagates, it generates an H field 53 represented in the drawing in exemplary fashion as entering the plane of the page at points 49 and exiting the plane of the page at points 51. The H field 53 is illustrated in the perspective view of Prior Art FIG. 3. E fields are not shown, but they are also generated by the voltages on the conductors.

In Prior Art FIG. 3, H fields 53A, 53B, 53C respectively generated by signal currents 48A, 48B, 48C emanate in a generally cylindrical orientation about the signal path, with the circles representing each field at a particular axial location along the conductive paths as shown. Depending on the magnitude and frequency of the current and the relative proximity of the signal paths, the resultant H field 53A generated by one signal 48A may extend spatially far enough to influence a signal 40B of an adjacent path and a signal 40C of a non-adjacent path. This form of coupling is referred to in the art as inductive coupling. Furthermore, the electric field created by the first signal 48A, for example, may couple to nearby signal paths 48B, 48C. This is known in the art as capacitive coupling. In this manner each of signals 48A, 48B, 48C may influence adjacent or non-adjacent signals.

It is well known in the art that a conductive medium has an inherent inductance caused by an H field generated about the medium by the current flowing through it. The closer a first medium is placed in proximity to a second medium, the more likely their respective H fields will influence each other. This, in turn, leads to an increased likelihood of crosstalk between media.

The theory of crosstalk in transmission lines is somewhat involved, but for printed circuit board connectors, the transmission line paths between a backplane and daughter card through male pins and female contacts are sufficiently short such that the signal propagation time is currently generally less than one-half of the rise time of the digital signals transmitted thereon. For this condition, the crosstalk amplitude increases as the signal rise time or frequency component increases. For the same reason, crosstalk increases with connector path length. Furthermore, the male pin/contact paths are characteristically inductive, causing increased signal attenuation as frequency increases. To accommodate high frequencies, or fast rise times, it is common to insert coaxial contact pairs in backplane to daughter card connectors. However, because coaxial pairs are expensive and bulky, they are used only in extraordinary circumstances.

The controlled-impedance lines of predominantly inductive prior art connectors are generally not matched between the backplane and daughter card, causing reflections when signal rise times approach the propagation delay of the connector paths. This causes signal distortion and attenuation and increases crosstalk due to multiple reflections, limiting high-frequency throughput. Shielded connectors are available to enhance throughput, but generally are expensive to produce and have relatively poor contact density per unit area. To achieve reduction of H and E fields at high frequencies, a shield is typically placed between each row of contacts on eat side (male and female) of the connector, a very complicated and expensive configuration. In this configuration, H field attenuation is provided by providing ground return paths adjacent each forward signal path E field attenuation is not fully effective because the resultant shield geometry is suboptimal. This phenomenon is detailed in Hybricon's Technology Focus publication H89107, incorporated herein by reference, which explains crosstalk for two parallel conductive paths.

Prior Art FIG. 15A is a side view of a conventional shielded connector, illustrating current flow in adjacent signal paths. For purposes of example, a backplane 32 includes a male connector 30 and a daughter card includes a corresponding female connector 34. Planar shields 202 are inserted between rows or columns (for example along the vertical cross section of FIG. 1B) of mated contacts 36A, 40A, and 36B, 40B, in such a manner that return currents $I_R$ between mating boards will pass through the shields, and thereby cancel or attenuate the H fields generated by the forward currents $I_F$ through the signal contacts. E fields generated by the voltage on the contacts are likewise terminated by the shields 202. This is analogous to the manner by which the E fields and H fields are contained by stripline traces on a printed circuit board.

In another technique for enhancing H field attenuation, signals are configured in the connector such that the nearest paths to a given forward signal path are return paths. This causes the H fields of nearest paths to be in opposite orientations, thereby tending to reduce the overall H fields which couple to other paths. The opposite potential also tends to reduce the respective E fields. This technique is somewhat effective but results in the wasteful use of pins as the return paths that are generally connected to the ground plane.

These techniques are somewhat effective due to the partial cancellation of the H and E fields between the forward and return paths of each of the signals. However, both approaches reduce signal contact density, which reduces the usefulness of the connector, and raises the cost per signal line through the connector. Other connectors from Vendors such as AMP, Augat, and Teradyne employ complicated stripline contacts to improve performance. However, such connectors are relatively expensive to produce.

SUMMARY OF THE INVENTION

The present invention is directed to a connector assembly and method for forming such an assembly which effectively mitigates the hazards of crosstalk between adjacent signal paths in an economic manner. Furthermore, transmission path characteristics are improved to achieve overall improvement of signal transmission at higher speeds.

Crosstalk and propagation delay are reduced in the present invention by configuring the connector to provide for cancellation or reduction of electromagnetic fields (H or B fields), in part by self cancellation, and independently of the electric fields (E fields). This configuration confers many significant advantages over conventional connectors, including performance, cost, and manufacturability.

In a first embodiment, the present invention includes a female contact, or pin, having a proximal end and a distal end. The distal end is adapted to conductively engage a mating male pin inserted at and electrically insulated from the proximal end. A region of the female pin and the male pin are electromagnetically coupled. A signal propagating through the connector generates a first H field of a first orientation about the male pin. At the contact point, this signal reverses direction and generates a second H field of a second orientation about the female pin. The first and second orientations of the H fields are substantially opposite which, in turn, causes the first and second H fields to substantially cancel in the region of electromagnetic interaction.

In a preferred embodiment, a conductor is coupled to the proximal end of the female pin. The conductor is substantially removed from the region of electromagnetic interaction and is shielded by ground planes such that the third magnetic field generated by the signal propagating through the conductor avoids interference with the cancellation of the first and second magnetic fields in the region. The conductor is preferably formed in a flexible circuit panel. The panel is preferably mounted to an "L" or "U"-shaped substrate such that the circuit panel and the conductors fold from a front face of the connector at the proximal end of the female pin to a side face of a connector.

A preferred connector embodiment includes a plurality of female pins supported by a female connector housing and adapted to mate with a like plurality of male pins mounted on a corresponding male connector housing. Each mated male pin and female contact are contained in cavities of plastic plated with a conductive metal which effectively shields the E fields of each mated pin/contact from the adjacent contacts. The present invention cancels out the H field of the signal, allowing the E fields to be confined with a simple electrostatic shield in the form of the plastic walls of the cavity and/or conductive plating mounted therein. The flexible circuit panel includes a plurality of conductors for conducting signals from the proximal end of the female contacts to an array of plated through-holes at a side face of the connector. The conductors and ground planes form controlled impedance stripline transmission lines. A ground reference is provided in close proximity to either side of the conductors. These striplines are of appropriate geometry to assure minimal crosstalk between adjacent conductors.

Contact pins are employed as terminals at the side face. The contact pins preferably comprise split roll pins in the form of a tubular malleable conductor having a longitudinal slot and a lateral slot. The longitudinal slot allows for compression and expansion of the roll pin in a mounting hole, for example a plated through-hole. The lateral slot allows for the roll pin to be mounted between first and second plated through-holes of different diameters.

BRIEF DESCRIPTION OF THE DRAWINGS

The foregoing and other objects, features and advantages of the invention wi4l be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIG. 2 is a close-up cutaway side view of the interface between the male pin and female contact of the prior art connector of FIG. 1A illustrating signal current flow and the resulting magnetic field in the region of the connector.

FIG. 3 is a perspective view of the interface of FIG. 2 illustrating crosstalk arising from electromagnetic interaction of adjacent signal paths.

DETAILED DESCRIPTION OF PREFERRED EMBODIMENTS

The present invention mitigates the effect of crosstalk in a connector by reducing the extent of electromagnetic field coupling between signal paths. A signal traversing through a connector of the present invention generates a first magnetic field of a first orientation as it propagates along a male pin to a point of contact at a distal end of a female connector, and likewise generates a second magnetic field of a second orientation substantially opposite the first orientation as the signal propagates along the body of the female connector to a termination point at a proximal end of the female connector. In this manner, a folded signal path is provided, causing the first and second opposed magnetic fields of the signal to essentially cancel. This in turn reduces or eliminates the likelihood that the signal propagating through the connector region will influence the propagation of nearby signals. This also reduces the self-inductance of the path, thereby reducing frequency-dependent attenuation of the path.

The present invention further provides isolation between electric fields of each contact in the form of electrostatic shielding, comprising conductive plating in the plastic cavities housing the female contacts. Because the signals traversing the male pin and female pin, or contact, enter and exit the cavity at the open end, construction of the shielded cavities is relatively straightforward and inexpensive, thereby extending the useful frequency range of the connector in an economical manner.

Figure 1A:
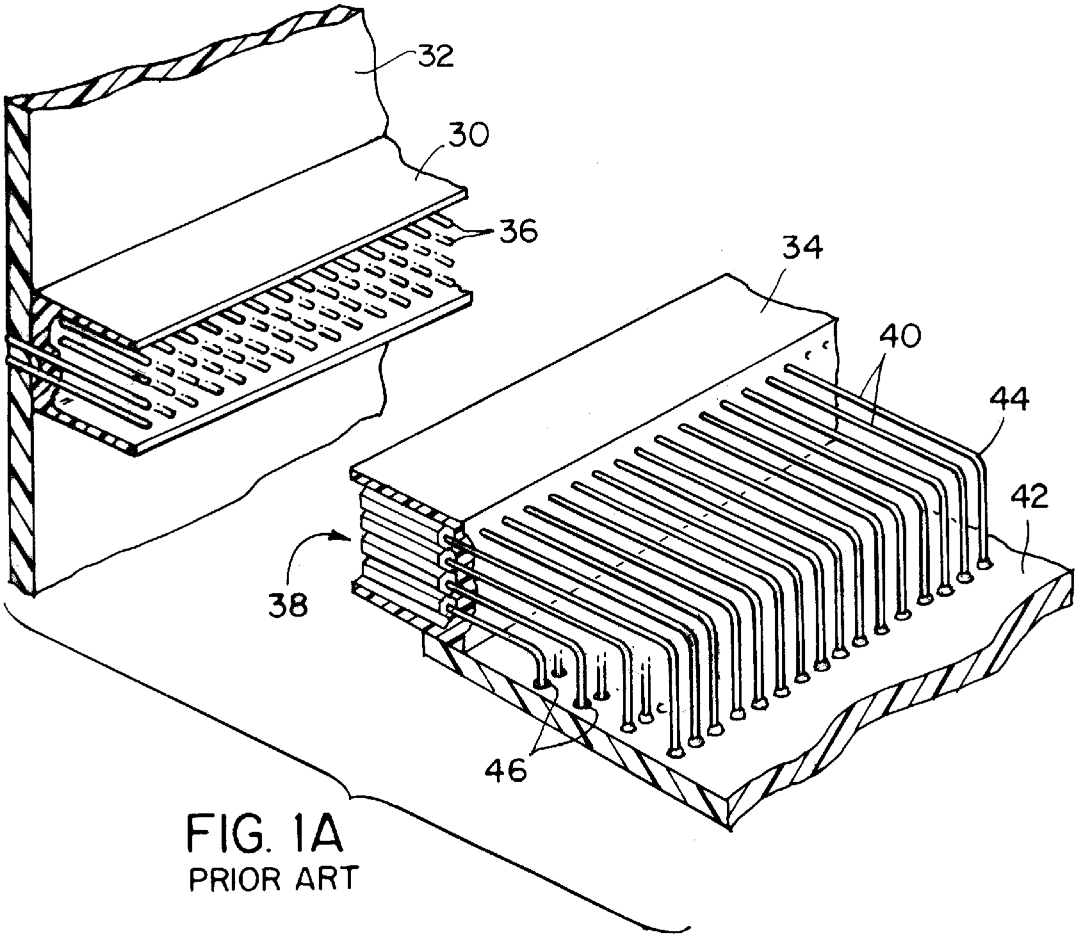
FIG. 1A PRIOR ART
FIGS. 1A and 1B are perspective and side views respectively of a prior art connector configuration.
Figure 1B:
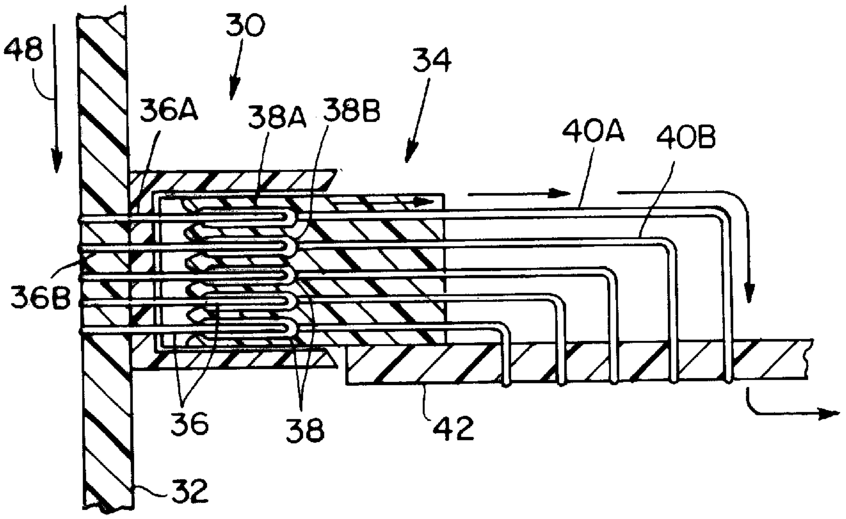
FIG. 1B PRIOR ART
Figure 4:
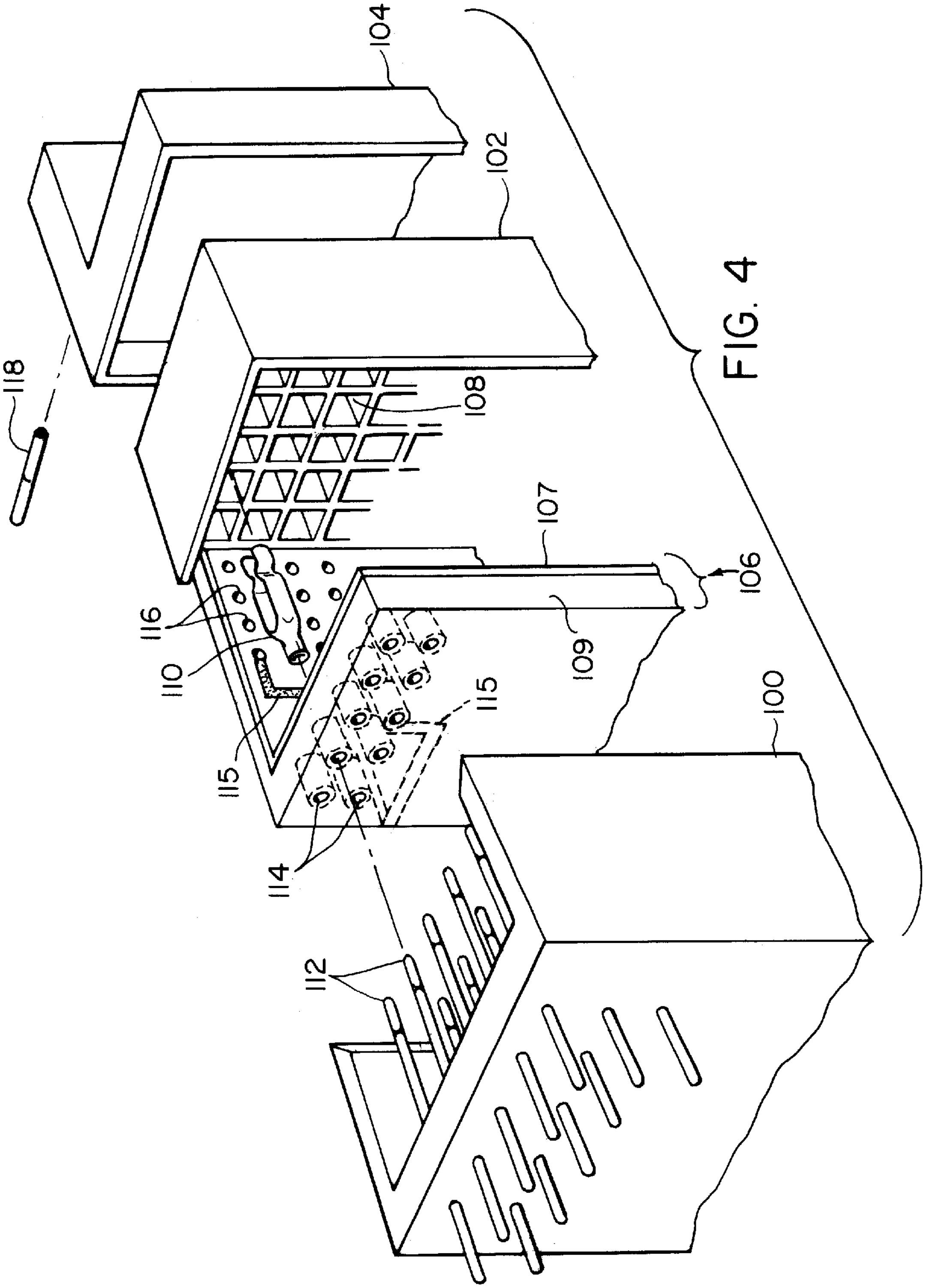
FIG. 4 is an exploded perspective view of a connector assembly in accordance with a preferred embodiment of the present invention.

FIG. 4 is a perspective illustration of a first preferred connector embodiment in accordance with the present invention The embodiment includes a male connector housing 100 having an array of male pins 112. A female connector housing 102 includes a corresponding array of female contacts 110 mounted in corresponding cavities 108. The array of female pins, or contacts 110, registers with the array of male pins 112. The housings 100, 102 include guides (not shown) or other features which assure alignment of their respective pins 112 and contacts 110.

Figure 5:
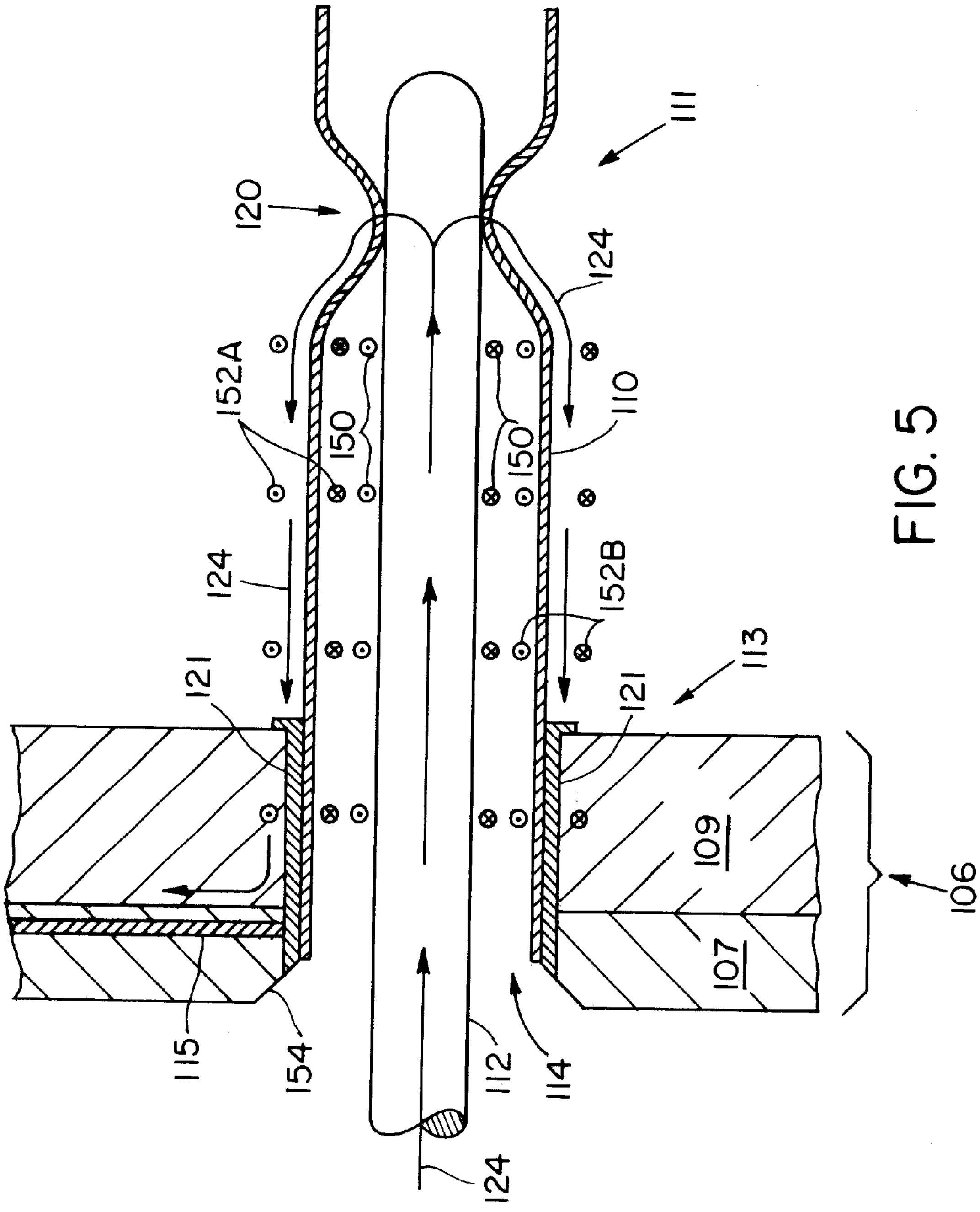
FIG. 5 is a close-up cutaway side view of the interface between the male pin and female pin of a preferred connector embodiment illustrating signal flow through the interface and the resulting offsetting magnetic fields in accordance with the present invention.
Figure 6:
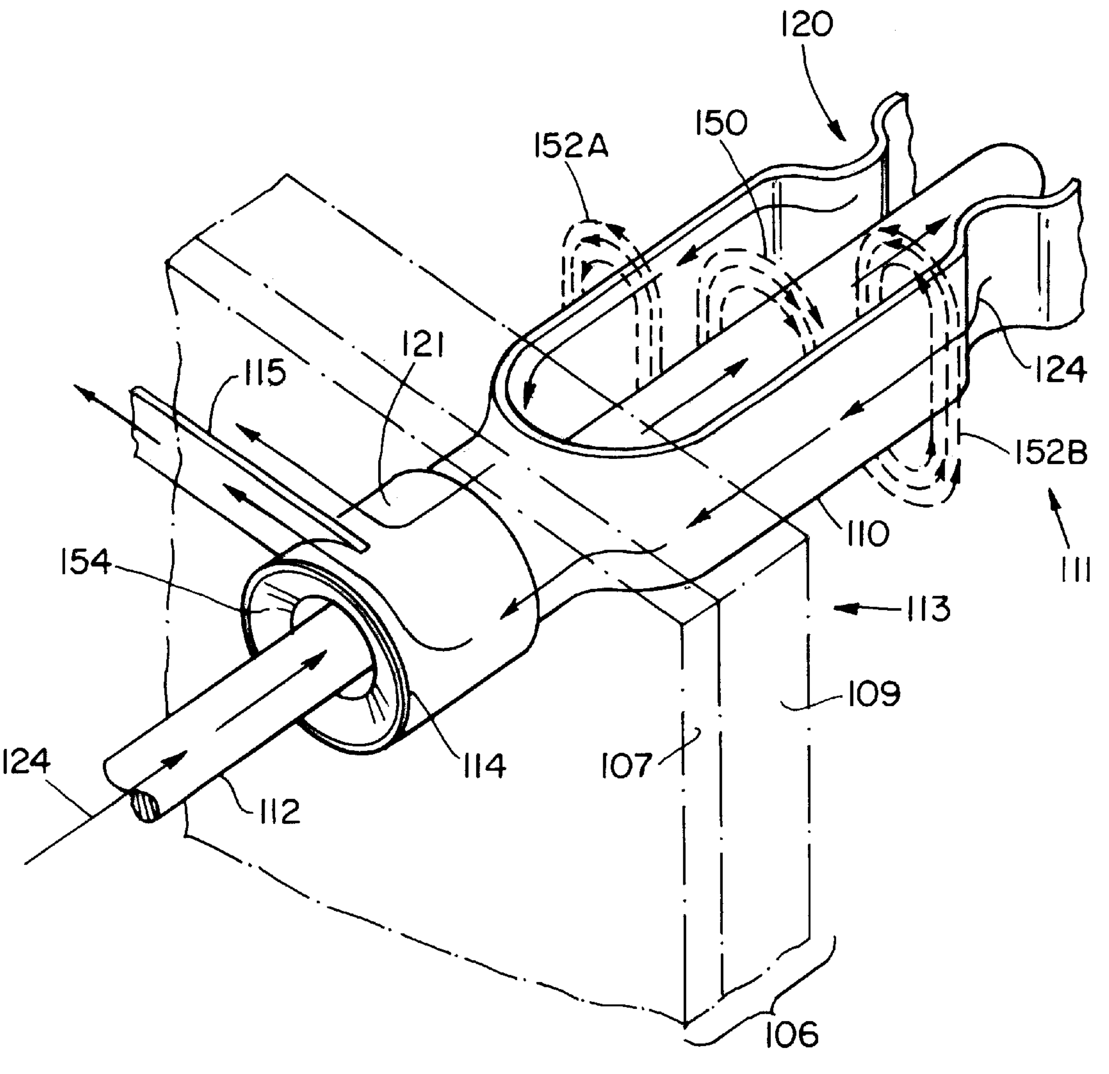
FIG. 6 is a perspective view of the interface of FIG. 5 illustrating cancellation of the magnetic fields in the region of the magnetic interaction in accordance with the present invention.

The male pins 112 pass through holes 114 in a flexible circuit panel and substrate assembly 106. The holes 114, in turn, are aligned with the proximal ends of the female contacts 110. The proximal ends are electrically coupled to corresponding conductive paths 115 formed on the flexible circuit panel and substrate assembly 106 as illustrated and described in further detail below in conjunction with FIGS. 5–7. The assembly 106 comprises a dielectric substrate 109 supporting a circuit panel 107 having multiple conductive paths 115 formed in layers. The circuit panel 107 may be provided on the inside face of the substrate as shown in FIG. 4, or preferably, on the outside face as shown in FIGS. 5 and 6, described below. The outside face is preferred to further lengthen the region of magnetic field cancellation, as will be described below.

Each conductive path 115 in the flexible circuit panel 107 serves as a communication medium between a female contact 110 and a corresponding terminal pin 118 mounted on the connector at right angles to each other, allowing signals to pass from an edge of the daughter card to its surface, as in the prior art. However the present invention accomplishes this in a controlled impedance environment with minimal crosstalk, because ground plane layers on either side of the conductive path layers provide a controlled-impedance stripline environment on the panel 107. In an alternative embodiment, assembly 106 is "U" shaped to add rigidity to the connector structure.

FIG. 5 is a close-up cutaway side view of the interface between the male pin 112 and the female contact 110 illustrating a preferred connector configuration of the present invention. A signal 124 propagates through the male pin 112 to a contact area 120 at a distal end 111 of the female contact 110. At the contact point 120, the signal 124 branches out and reverses direction along the walls of the female contact 110. From there, the signal 124 propagates along the conductive material of the plated through-hole 121, and further along stripline conductor 115 of the flexible circuit panel 107.

As the signal 124 propagates in the first direction along male pin 112, it generates a magnetic field 150 oriented in a first direction about the surface of the pin 112 as shown. Likewise, as the signal 124 propagates in the second direction along the body of the female contact 110, it generates a second magnetic field 152A, 152B, oriented in a second direction as shown. The first magnetic field 150 and second magnetic field 152 are oriented in substantially opposite directions such that they tend to substantially cancel each other. This reduces the extent of the net magnetic field outside of the region of contact such that the net field is insufficient for inducing crosstalk with signals of nearby interconnect paths, thereby mitigating the likelihood of crosstalk.

The orientation of the respective magnetic fields 150, 152 is more clearly illustrated in the perspective view of FIG. 6 where it is shown that signal 124 propagating along male pin 112 generates a magnetic field oriented in a clockwise direction, a portion of which is illustrated at 150. At the contact region 120, referred to herein as a contact “point”, the signal reverses direction and propagates along the body of the female contact 110, generating a magnetic field 152 oriented in a counterclockwise direction as shown. In the embodiment illustrated, the body of the female connector divided into two segments, forming two conductive paths, resulting in first and second counterclockwise magnetic fields, portions of which are shown at 152A, 152B respectively. At the proximal end 113 of the female contact 110, the segmented signal recombines and propagates through plated material of through-hose 116 and conductor 115 to another portion of the flexible circuit panel 107. Sloped guides 154 may be formed on the face of the substrate 109 to further pin/contact alignment.

Figure 15A:
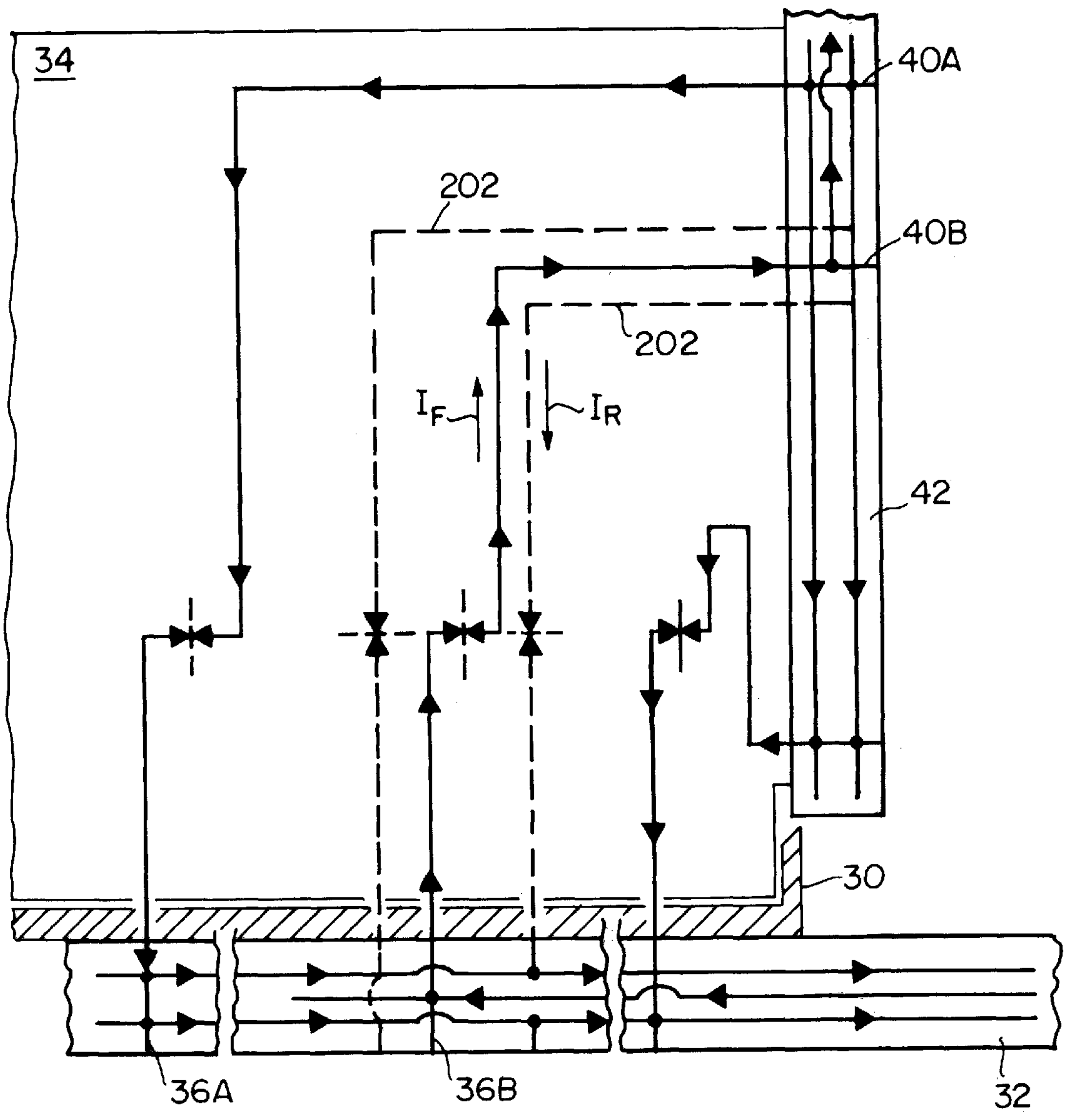
FIG. 15A PRIOR ART
FIG. 15A is a schematic side view of a conventional shielded connector, illustrating the directions of forward and reverse current flow.
Figure 15B:
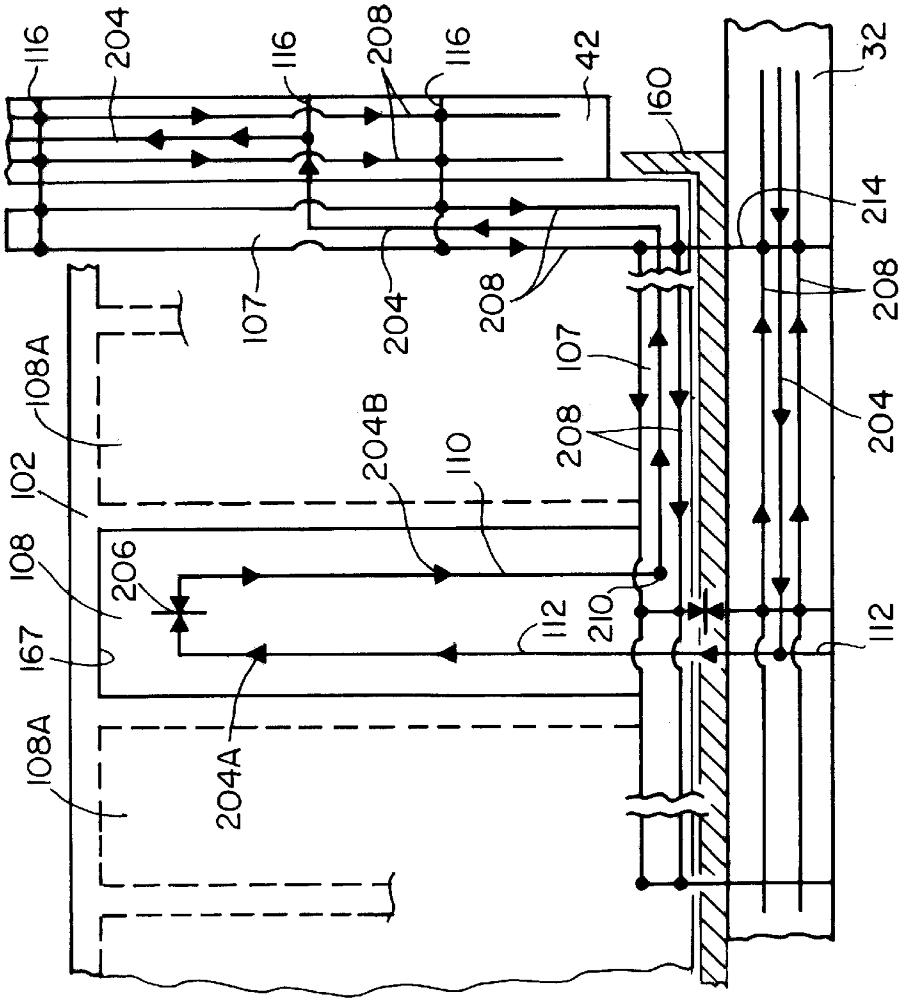
FIG. 15B is a schematic side view of a connector in accordance with the present invention, illustrating self-cancellation of H fields, allowing for simple shielding of E fields.

FIG. 15B is a schematic side view of a connector, illustrating self-cancellation of H fields, and allowing for simple shielding of E fields, in accordance with the present invention. A female connector housing 102 and flexible circuit panel are mounted to an edge of a daughter card 42, and a male connector 160 is mounted to a backplane 32. Note that this illustration is for purposes of example, and a number of configurations are possible. For example, the female connector may be mounted to the backplane and the male connector mounted to the daughter card, or the connectors may be mounted to mating PC boards, etc.

The male pins and female contacts mate (illustrated schematically by contact point 206) to provide a signal path as shown by arrows 204. The signal 204 propagates along backplane 32, through male pin 112, to contact point 206. At the contact point 206, the signal 204 reverses direction and propagates along female contact 110, through flexible circuit panel 107, to press fit contact 116, and into the daughter card 42. The signal 204 is preferably shielded by conventional stripline shielding 208 in the backplane 32, flexible circuit panel 107 and daughter card 42. As described above, signal propagation through the contact chamber region 108 is adapted to cancel the H fields, by virtue of the folded path geometry.

Cancellation of H fields of the signal 204 in the contact chamber 108 is provided along the interface of the male pin 112 and female contact 110 to the point 210 where the female contact 110 makes contact with the conductor on the flexible circuit panel 107. At this point 210, the reverse current 204B on the female contact deviates from the forward current 204A on the male pin 112, and cancellation of the H field ceases. It is therefore preferable to position the portion of the flexible panel 107 running parallel to the backplane 32, as close to the backplane as possible.

Prevention of crosstalk due to E fields is simplified in the present invention by virtue of H field cancellation due to the folded path geometry. E field shielding is accomplished via a conductive shield 167 preferably formed by a plating or coating on the surfaces of the chambers 108 which encompass the contact area, and is low resistance contact with a ground plane return path 214. This is described below in detail with reference to FIG. 9. The shield 167 is effectively at the circuit ground potential and effectively contains the E field of the signal. The conductive honeycomb 102 (see FIG. 4) can be implemented in many ways. In the preferred embodiment, the honeycomb is molded in plastic, upon which copper is deposited, along with additional copper plating over the copper deposition. Solder or other metal is plated over the copper for solderability. Other formation techniques are equally applicable.

Figure 9:
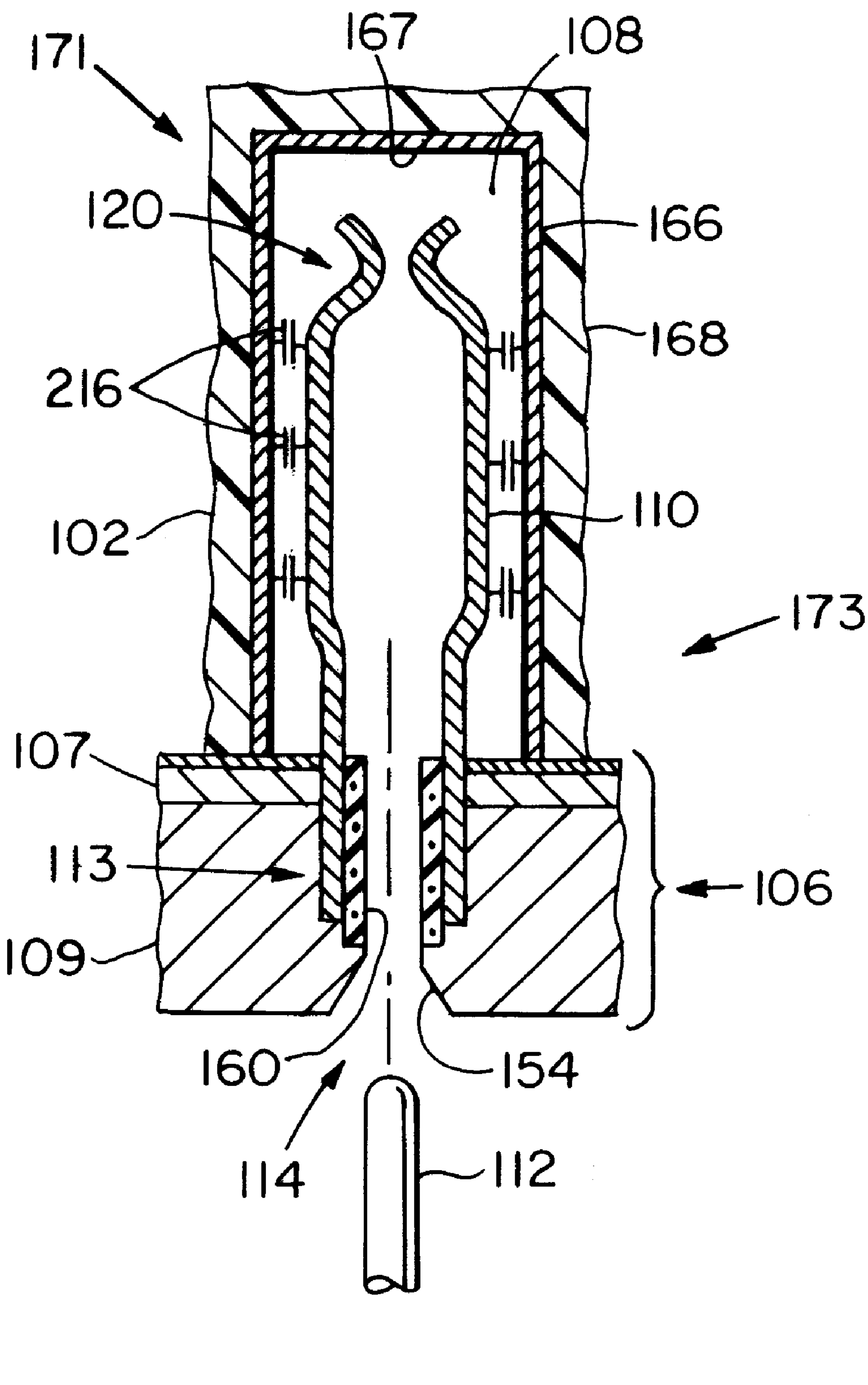
FIG. 9 is a cutaway side view of second preferred embodiment of a female contact interfacing with a male pin.

The metallic plating forming the shield 167 provides a double wall of conductive material between each signal contact, for example between the contacts of chamber 108 and adjacent chamber 108A, in adjacent rows and columns. As seen in FIG. 9, the female contact thus is substantially enclosed by a conductive material, with each wall providing an independent path for capacitive currents. Capacitors 216 (see FIG. 9) schematically represent the continuous stray capacitance between the female contact 110 and the surface of the conductive metal plating 167 of the shield. There are currents flowing through these stray capacitances which are functions of the amount of capacitance and the rate of change of the differences in voltage at each location of the contact 110, and corresponding locations on the shield 167. These currents generate voltages on the shield because the shield itself has an impedance. With only a single shield layer between contacts, as in prior art configurations, the shields themselves would introduce crosstalk between adjacent contacts. In the double-layer shield arrangement of the present invention, the shield adjacent each contact eliminates, or substantially reduces, the E fields produced by these voltages so that cross coupling between neighboring contacts is essentially eliminated. Similarly, the currents produce electromagnetic fields which are substantially eliminated by eddy currents induced in the adjacent shields surrounding neighboring pins.

It is noteworthy that in the present configuration, it is not essential that the E field shield carry return currents, as is the case in the prior art shielded connector configuration shown in FIG. 15A, in which the shields are fabricated in two parts with integral mating contacts to provide return paths for both E and H fields simultaneously. This important difference, and the folded shape of the contact path, allows the E shield of the present invention to be molded or otherwise fabricated as a single part, reducing manufacturing costs of the shield considerably as compared to conventional configurations.

In a preferred embodiment, the opening of the female contact at its “proximal end” avoids contact with the male pin. If contact is made, accidentally or otherwise, at the opening, then the interface would effectively operate as a short pin. This would not prevent the connector from functioning; but if accidental, any contact may generate noise in the signal.

While the terms “proximal end” and “distal end” are used above to describe portions of a preferred embodiment of the female contact, such terms are interchangeable with “first end” and “second end” in alternative embodiments and do not necessarily describe their relative spatial positions. For example, the male pin may make contact with the female contact near its opening, and the female contact may be shaped to fold back on itself, thereby providing the “folded path” geometry of the present invention.

Figure 7:
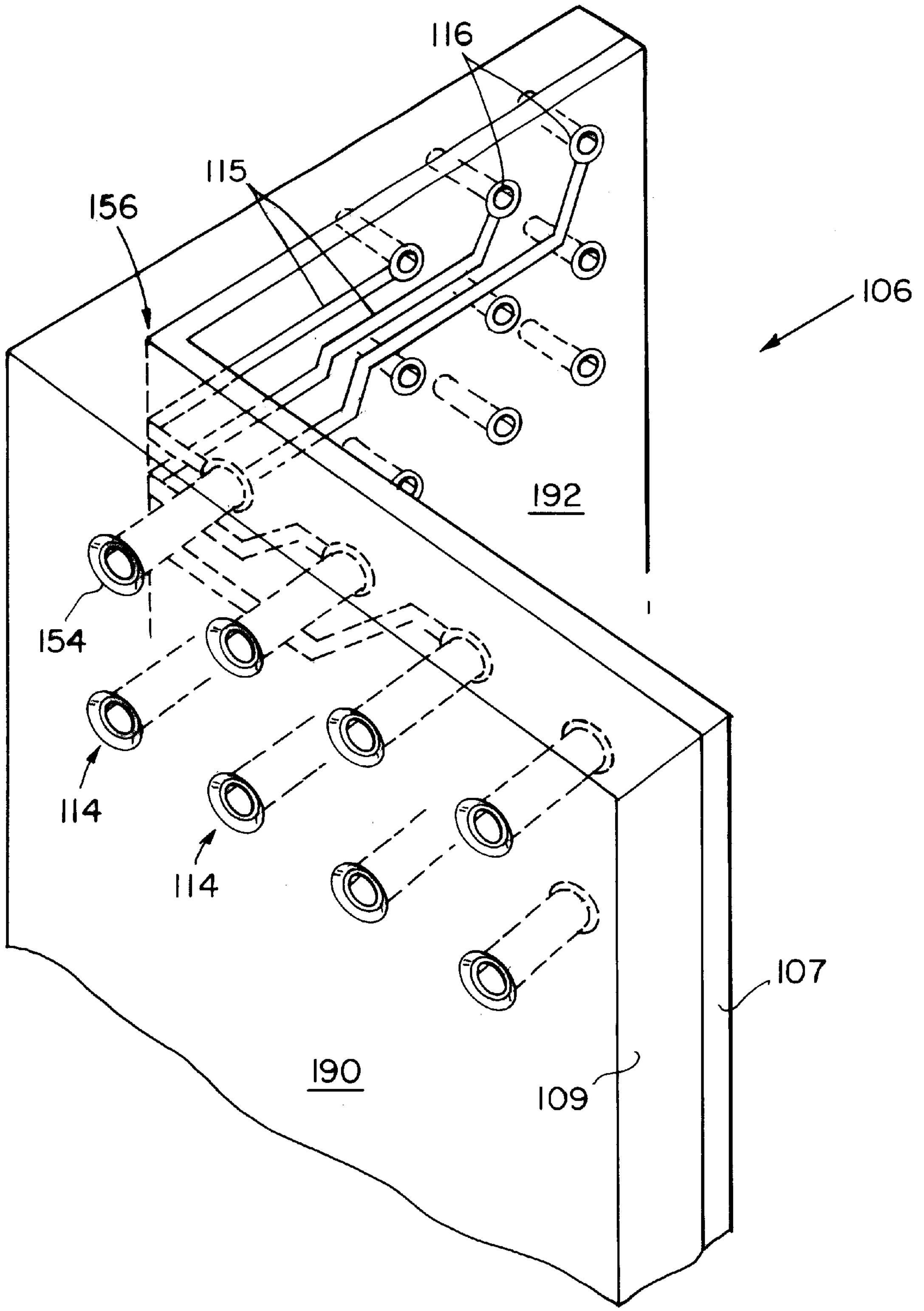
FIG. 7 is a perspective view of a preferred embodiment of a flexible circuit panel mounted to a contact and roll pin alignment substrate in accordance with the present invention.

FIG. 7 is a perspective view of a circuit panel and substrate assembly 106 in accordance with the present invention. The circuit panel and substrate assembly 106 includes an “L”-shaped dielectric substrate 109 which supports a flexible circuit panel 107. The circuit panel 107 comprises a plurality of conductive paths 115 which conduct signals from the female contacts on a face 190 of the panel, past corner 156 to terminal holes 116 on a side leg 192 of the assembly. The conductive paths 115 are spaced apart such that signals propagating thereon do not interfere with each other. The flexible circuit panel 107 is preferably formed in a stripline or microstrip circuit configuration to suppress interference. Ground planes on the panel are generally continuous, except in the region of the contact clearance holes 114 to avoid contact with the signals. The circuit panel 107 may be mounted to the inside face of the substrate 109 as shown in FIG. 7, or to the outside face as shown in FIG. 5. Although the preferred embodiment employs flexible printed circuit construction, the invention may also be implemented using standard single or multiple layered rigid printed circuit techniques where the rigid circuit board is shaped as necessary, referred to herein as a "bent-rigid" PC board. The rigid circuit board may be provided with or without the rigid substrate 109. In a hybrid embodiment, the circuit panel 107 may be provided using "rigid-flex" technology, where the panel is rigid in the regions of the flat surfaces 190, 192, and flexible at the corner 156.

Figure 11:
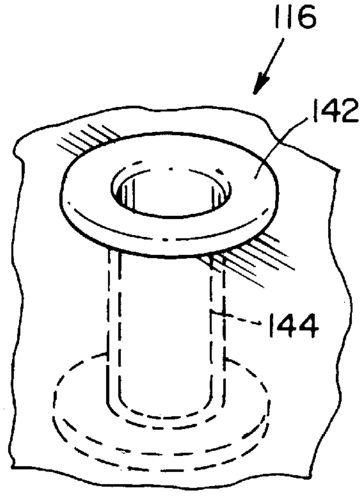
FIG. 11 is a perspective view of a plated through-hole in accordance with the present invention.

Following mounting of the flexible circuit panel 107 to the substrate 109, the plated contact and terminal holes on the panel 107 may be further plated together with plated through-holes 116 as shown in FIG. 11. The though-holes 116 provide a reliable contact between the assembly 106 and the female contacts 110 and roll-pin terminals 118. The substrate further provides structure for supporting the female contacts and for holding the contacts in alignment with the shielding chambers.

Figure 8A:
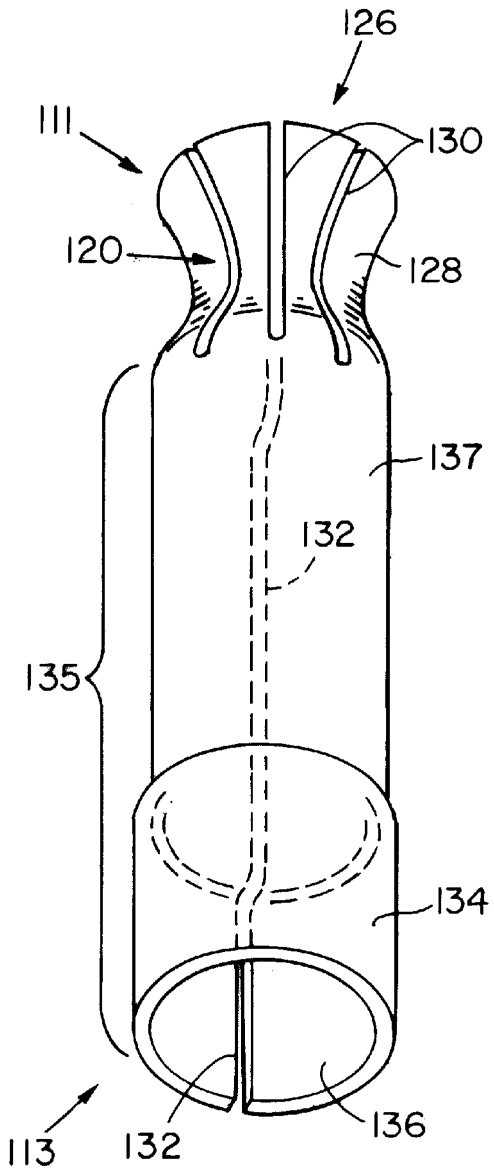
FIGS. 8A and 8B are perspective views of preferred embodiments of female contacts in accordance with the present invention.

FIG. 8A is a perspective illustration of a preferred embodiment of the female contact 126 in accordance with the present invention. This embodiment includes a continuous cylindrical body 135 having a widened portion 134 at a proximal end near the opening or orifice 136, a tapered body portion 137, and a flared contact location 120 at a distal end. The body of the contact is continuous except for a longitudinal slot 132 which permits the contact 126 to adapt to deviations in the mounting surface, assuring a snug fit between the outer surface of non-tapered portion 134 and the inner surface of plated hole 114 (see FIG. 7). Slots 130 extend from the tapered body portion 137 to the distal end 111 to form tapered contact leaves 128 which are flared outward beyond contact area 120 as shown. The smallest internal diameter between the contact leaves 128 is slightly smaller than the external diameter of the male pin such that the material surfaces of the contact leaves are biased to conductively engage the surface of an inserted male pin. The orifice 136 at the proximal end 113 is wider than the remainder of the body to avoid contact with an inserted male pin. Contact at the proximal end could cause intermittent noise and increase insertion force. This embodiment is especially well adapted to be press fit in a plated through hole 114 formed on the flexible circuit panel and substrate assembly 106. In general, the female contact should be of sufficient length so as to minimize insertion force and to reduce the radii of the contact leaves 128.

Figure 8B:
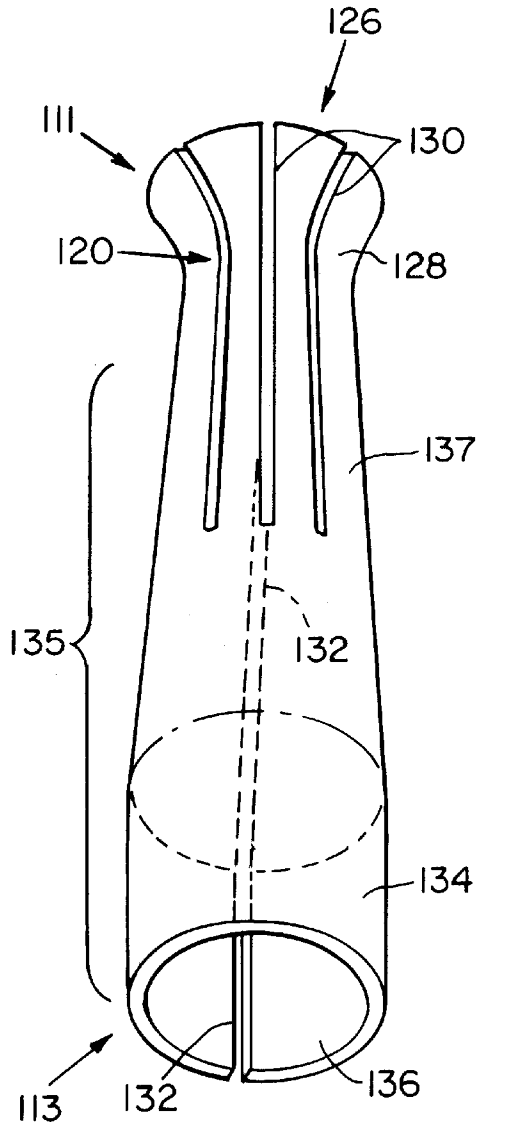

FIG. 8B illustrates an alternative configuration where the body portion 137 is tapered between the opening 136 and contact region 126. In this configuration, slots 130 are preferably longer to achieve lower insertion force.

Figure 16:
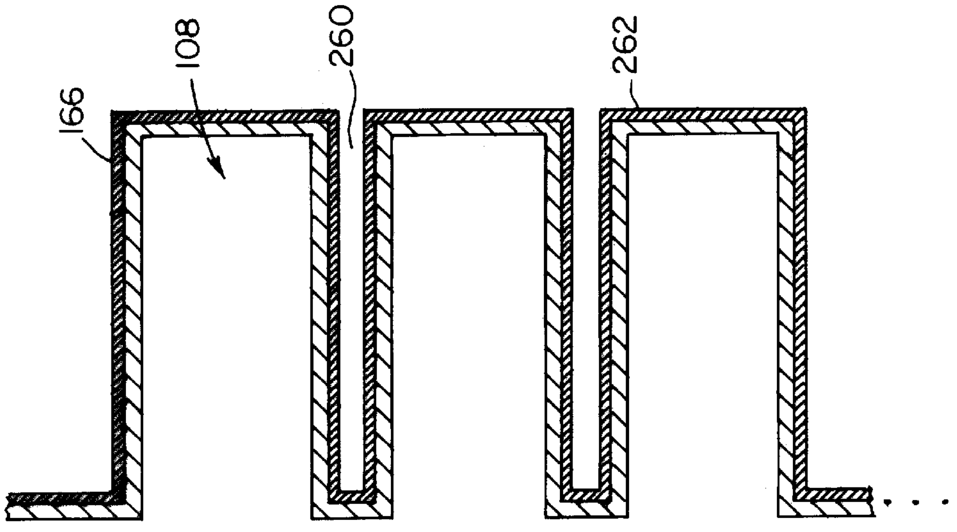
FIG. 16 is a side view of an alternative shielding configuration, in accordance with present invention.

FIG. 9 is a cutaway side view of a female contact 120 mounted to a flexible circuit panel and substrate assembly 106 and inserted into a connector chamber 108 on the female connector housing 102. In this embodiment, the contact 110 is mounted to substrate 109 of the flexible circuit and substrate assembly 106 such that a cylindrical portion 160 of dielectric material serves as an insulator between an inserted male pin and the proximal end 113 of the female contact 110. The cylindrical portion 160 further serves as a guide during insertion of the male pin. This assures that contact is made in the preferred contact region 120 at the distal end to give the full effect of cancellation of the magnetic fields. The wider section of hole 114 can be plated with overlapping conductive material to assure satisfactory contact between the panel 107 and contact 110. The chamber 108 walls of the cover 102 are formed of standard connector material 168, for example plastic. The inner wall of the chamber is lined with conductive plating 166 which is preferably coupled to ground to serve as a shield for the electric field of the signal propagating along the pin 112 and contact 110 as described above. An insulating coating 167 can be applied to the conductive plating 166 to prevent accidental grounding of the female contact 110. In an alternative embodiment shown in FIG. 16, each chamber 108 is separated by region 260. In this configuration, the conductive shield 166 may be applied to the outer surface 262 of the chambers 108 to provide an electric field shielding function. In further alternative configurations, the conductive shield may comprise a wire mesh, preferably an insulated wire mesh, in which case, the chamber 108 walls need not be continuous. The term "enclosed", or "substantially enclosed", as used herein, when referring to the geometry of the chamber, may include a chamber with a solid, continuous wall or alternatively, a wire mesh wall with apertures, in which case, the apertures should be small enough to provide sufficient electrostatic shielding.

The present invention effectively cancels E-field crosstalk in a simple configuration. This simplicity is especially apparent in the electrostatic shielding 168 of the individual chambers. Each cavity 108 is closed at a distal end 171 and open at a proximal end 173. A signal enters and exits the chamber at the open proximal end 173 via the inserted male pin 112 and the trace 107 at the face of the female connector 110. In this manner, the distal end 171 and the side walls of the chamber are continuous and closed such that the electrostatic shield 166 can be deposited in the chamber as a continuous layer. This is unlike the conventional configurations where the signal enters at the proximal end 173 and exits at the distal end 171, making electrostatic shielding of conventional connectors complex and expensive.

Figure 10:
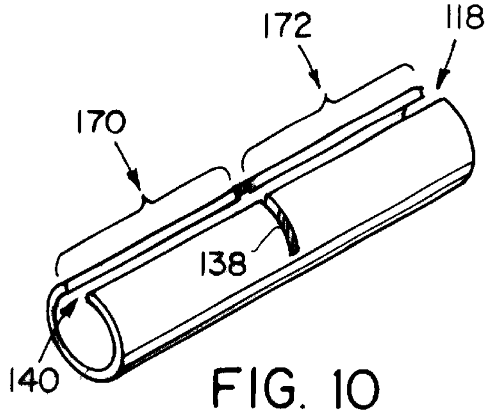
FIG. 10 is a perspective view of a roll-pin in accordance with the present invention.

FIG. 10 is a close-up perspective view of a preferred implementation of terminal 118 shown in FIG. 4 in the form of a roll pin in accordance with the present invention. The roll pin 118 of FIG. 10 is generally cylindrical in shape and hollow in cross section and is adapted for coupling the plated through-holes 116 of the flexible circuit board shown in FIG. 4 to a similar hole on a daughter card. The body of the roll pin 118 includes a longitudinal slot 140 and a lateral slot 138. The longitudinal slot 140 preferably runs the length of the pin 118, whereas the lateral slot 138 cuts across a portion of the circumference of the pin at or near the center of the length of the pin, depending on the application. The longitudinal slot 140 allows for the pin body to be circumferentially expanded or compressed in a plated through-hole 116. Ideally, all plated through-holes 116 are of uniform diameter, but in practice, they can vary to a significant degree. The lateral slot 138 permits the degree of compression, and thus the outer diameter of the roll pin 118 to be different in each plated through-hole. If one of the holes is axially deeper than the other, the lateral slot can be cut asymmetrically at a position other than the center of the pin, to assure proper contact in each hole.

Figure 12:
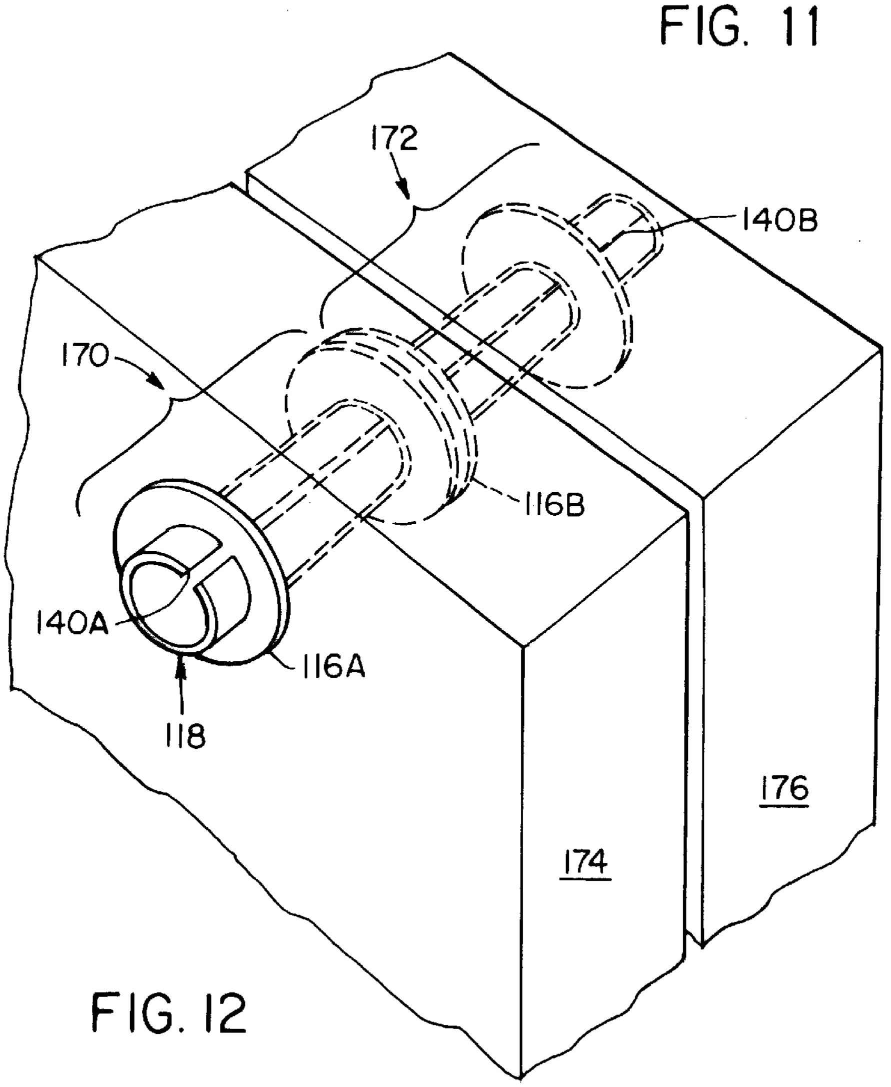
FIG. 12 is a perspective view of a roll-pin used for interconnecting two boards in accordance with the present invention.

FIG. 12 is a perspective illustration of the roll pin 118 of FIG. 10 electrically coupling plated through-holes 116 of first and second circuit boards 174, 176, respectively. A first portion 170 of the roll pin 118 is press fit in the through-hole 116A of the first circuit board 174, and a second portion 172 is press fit in a plated through-hole 116D of a second board 176. The longitudinal slot 140A of the first portion 170 is wider circumferentially than the longitudinal slot 140B of the second portion 172. This difference in slot width arises because the respective width of the plated through-holes 116A and 16B are different. The lateral slot 138 shown in FIG. 9 allows for this difference in longitudinal slot widths as described above.

As described above, crosstalk can arise due to magnetic field coupling (inductive) or electric field coupling (capacitive). The magnetic field coupling in the contact region is essentially annulled by the folded geometry illustrated above. Note that the preferred geometry is coaxial using a cylindrical female contact, but all geometries which achieve cancellation are applicable to the present invention.

Any remaining electric field coupling is effectively eliminated by conductive plating 116 in the chamber walls, as shown in FIG. 9. A significant advantage of this invention is that the conductive shielding around the region of contact can be provided by a thin conductive plated coating which is inexpensive to deposit. This is because the shield is not required to carry heavier currents associated with reduction of H fields. The plating, following application, is next insulated, for example conformal coated, to prevent accidental grounding of the signal within the confines of the connector housing. This shielding is deposited on inner and outer surfaces of the housing with an exposed outer plating to provide a ground connection where the two connector housings make contact.

Figure 13:
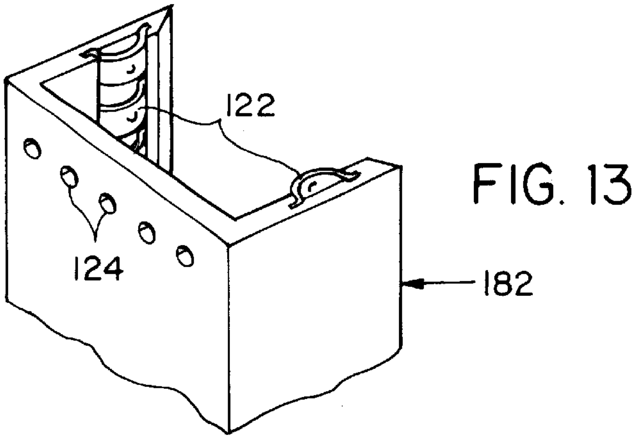
FIG. 13 is a perspective view of an alternative embodiment of a male pin connector housing in accordance with the present invention.

The backplane male connector and the female daughter card connectors are designed to transfer ground paths in the mating process. FIG. 13 is a perspective view of a preferred male connector housing 182 for accomplishing this. The housing 182 includes holes 124 for mounting the male pins and rows of spring contacts 122 flanking the two outside pin rows to provide a ground return path. In a stripline board configuration the ground springs 122 contact the ground plane of the stripline printed circuit board when the male and female connector assemblies are mated. Each high and low point of the spring contact is dimpled to assure contact at every location. Additional holes 183 are conductively plated to contain pins which press fit with the backplane to complete the ground path.

Figure 14A:
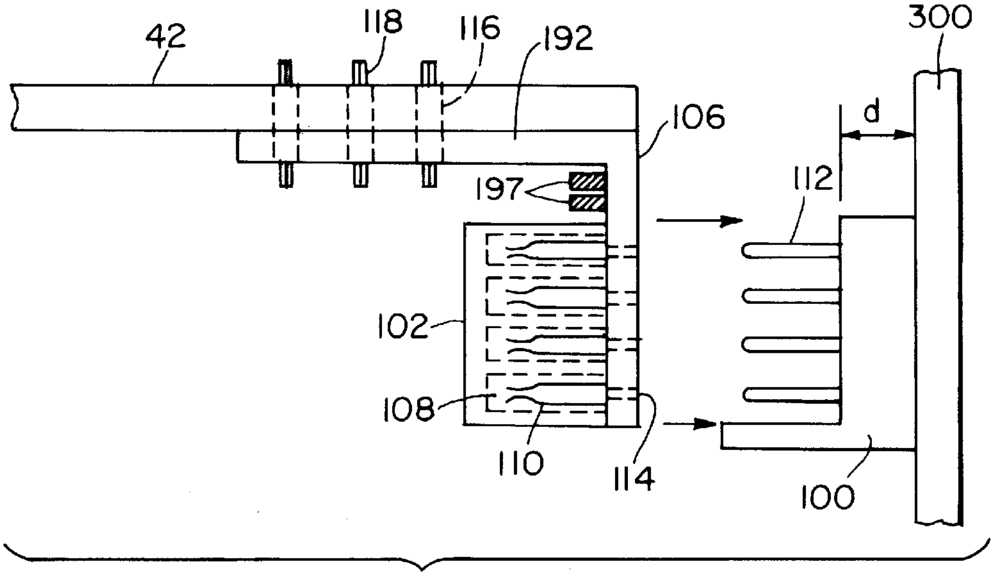
FIGS. 14A and 14B are side views of alternative female connector configurations in accordance with the present invention.
Figure 14B:
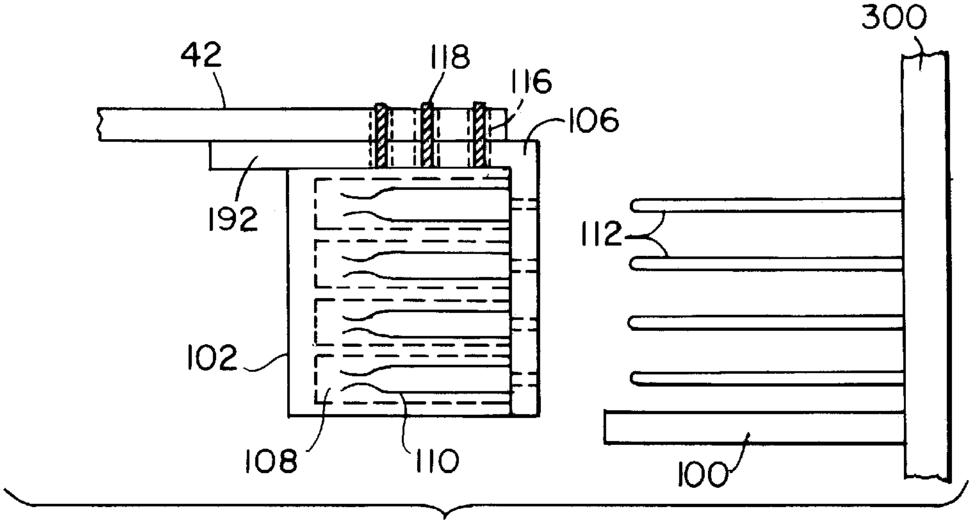

FIGS. 14A and 14B are cutaway side views of alternative embodiments of the present invention. In the embodiment of FIG. 14A, the female connector housing 102 is mounted to the substrate assembly 106 such that the side wall of the connector housing 102 and the leg 192 of the assembly 106 are spaced apart as shown. In certain applications, input/output transceivers 197 may be mounted to the substrate 106 for energizing signal exchange between boards, thereby reducing signal delay. Alternatively, the transceivers 197 may be mounted to the side leg of the substrate assembly 192. In each embodiment, the male connector housing 100 is adapted to mate with the alternative female connector profiles.

FIG. 14B illustrates a male connector embodiment having male pins 112 mounted directly to motherboard 100. This configuration is preferred for increasing the magnetic interaction between the signal traversing the male pin 112 and female contact 110. By eliminating the plastic connector material, the region of no interaction (for example, over distance d of FIG. 14A) is reduced or eliminated, enhancing connector performance. Shorter connection paths between the female contacts 110 and conductors on the daughter card 42 are realized in the embodiment of FIG. 14B by mounting roll-pin contacts 118 closer to the face of the female connector 102, for example at the side of the connector housing, as shown.

The present invention further offers the advantage of a low connector insertion force. This arises because thin materials can be used for the female contact, for example a material of 0.003 inches as compared to prior art female contacts of 0.01 inches. Thin materials are sufficient because in the present invention the contact area is protected on all sides by the chamber walls, including the rear wall of the chamber, unlike conventional configurations.

While this invention has been particularly shown and described with references to preferred embodiments thereof, it will be understood by those skilled in the art that various changes in form and details may be made therein without departing from the spirit and scope of the invention as defined by the appended claims.

We claim:

1. A connector comprising:

a female contact having a proximal end, a body, and a distal end, said distal end including a contact location adapted for conductively engaging a mating male pin inserted at and electrically insulated from said proximal end, so as to create an interspace region about the male pin between the proximal and distal ends and along the body of said female contact; the body of the female contact being parallel to the male pin in the interspace region; and a conductive chamber for housing said female contact, said female contact mounted in said chamber such that said body and said distal end are enclosed by said chamber, and such that said proximal end is accessible by said male pin; said female contact being electrically insulated from said chamber housing.

2. The connector of claim 1 wherein the chamber is coated with a conductive material.

3. The connector of claim 2 wherein the conductive material comprises a material selected from a group of materials consisting of conductive plating and wire mesh.

4. The connector of claim 2 wherein the conductive material provides shielding of electric fields generated by a signal propagating through said male pin and female contact.

5. The connector of claim 1 wherein a signal propagating through the connector generates a first magnetic field of a first orientation about said male pin and generates a second magnetic field of a second orientation about said female contact; said first and second orientations being substantially opposite, causing said first and second magnetic fields to substantially cancel in said interspace region.

6. The connector of claim 1 further comprising a conductor coupled to said proximal end of said female contact.

7. The connector of claim 6 wherein said conductor is formed on a circuit panel selected from a group of panel types consisting of: a rigid panel, a flexible panel, and a rigid-flex panel.

8. The connector of claim 6 wherein said conductor is mounted to a substrate, which substrate folds across a front face of said connector at said proximal end of said female contact to a side face of said connector.

9. The connector of claim 8 wherein the substrate is "L"-shaped.

10. The connector of claim 8 wherein the substrate is "U" shaped.

11. The connector of claim 8 further comprising signal transceivers coupled to the conductor and mounted to said substrate.

12. The connector of claim 1 further comprising a female connector housing having a plurality of said chambers for housing a plurality of said female contacts and for receiving a plurality of mating male pins mounted to a corresponding male connector.

13. The connector of claim 12 wherein interior walls of said chambers are coated with a conductive shielding material such that female contacts of adjacent chambers are shielded from each other by a dual layer of conductive coating.

14. The connector of claim 12 wherein exterior walls of said chambers are coated with conductive shielding material.

15. The connector of claim 1 wherein the female contact is secured in a circuit panel aperture formed in a circuit panel.

16. The connector of claim 15 wherein the female contact is press-fit in the circuit panel aperture.

17. The connector of claim 15 wherein the female contact is soldered in the circuit panel aperture.

18. The connector of claim 15 wherein the circuit panel is selected from the group of panel types consisting of a rigid panel, a flexible panel, and a rigid-flex panel.

19. The connector of claim 15 further comprising electronics coupled to and mounted proximal to said female contact on said circuit panel.

20. A female connector adapted for registering with male connector having male pins comprising:

a plurality of female contacts, each female contact having an opening for receiving a male pin at a proximal end and having a coupling portion at a distal end for conductively engaging the male pin, the female contact being insulated from the male pin at the proximal end by an insulating portion, a body portion being defined between the proximal end and distal end, the body portion and the male pin being parallel and proximal to each other and magnetically coupled so as to provide a region of magnetic cancellation for a first magnetic field of a first orientation generated by a signal propagating through the male pin and a second magnetic field of a second orientation generated by the signal propagating through the corresponding female contact;

a substrate supporting and spatially positioning said female contacts, said substrate including a plurality of apertures corresponding with said openings of said female contacts;

conductive paths in said substrate electrically coupled to the female contacts at their proximal ends; and a plurality of conductive chambers for housing said female contacts, said female contacts positioned in said chambers such that said contacts are enclosed in said chambers by said substrate, and such that said proximal ends are accessible by said male pins through said apertures; said female contacts being electrically insulated from said chambers.

21. The connector of claim 20 wherein the chambers are coated with a conductive material.

22. The connector of claim 21 wherein the conductive material comprises a material selected from a group of materials consisting of conductive plating and wire mesh.

23. The connector of claim 21 wherein the conductive material provides shielding of electric fields generated by a signal propagating through said male pins and female contacts.

24. The connector of claim 20 wherein said conductive paths are formed on a circuit panel selected formula group of panel types consisting of a rigid panel, a flexible panel and a rigid-flex panel.

25. The connector of claim 24 further comprising contact pins coupled to the conductive paths at a side of the connector.

26. The connector of claim 25 wherein the contact pins comprise tubular roll pins, each having a longitudinal slot and a lateral slot, the longitudinal slot allowing compression of each said roll pin in a mounting hole formed in the circuit panel and said lateral slot allowing for different respective degrees of compression in mounting holes of different inner diameters.

27. The connector of claim 24 wherein said circuit panel is mounted to an "L"-shaped substrate which folds from a front face of said connector at said proximal end of said female contact to a side face of said connector.

28. The connector of claim 20 wherein a region of each female contact between the proximal and distal ends is magnetically coupled with the corresponding male pin such that a signal propagating through the connector generates a first magnetic field of a first orientation about said male pin and generates a second magnetic field of a second orientation about said female contact; said first and second orientations being opposite, causing said first and second magnetic fields to substantially cancel in said region.

29. A connector comprising a female contact having a first end and a second end and a body region between the first end and the second end, said second end conductively engaging a mating male pin inserted at said first end, and electrically insulated from said first end and said body by an insulating member, in the intersect region the body region of said female contact and said male pin being parallel so as to create an interspace region about the male pin between the first and second ends and along the body of the female contact, and proximal to each other and magnetically coupled such that a signal propagating through the connector generates a first magnetic field of a first orientation about said male pin and generates a second magnetic field of a second orientation about a portion of said female contact; said first and second orientations being opposite, causing said first and second magnetic fields to substantially cancel in said body region.

30. The connector of claim 29 further comprising a conductor coupled to said first end of said female connector.

31. The connector of claim 30 wherein said conductor is mounted to a flexible circuit panel.

32. The connector of claim 29 further comprising a female connector housing for supporting a plurality of said female contacts and for receiving a plurality of mating male pins mounted to a corresponding male connector housing.

33. The connector of claim 32 further comprising chambers for housing said female contacts.

34. The connector of claim 33 wherein said chambers are coated with a conductive shielding material such that electric fields generated by said signals in said regions are substantially confined to said chambers.

35. A female contact having a proximal end, a body, and a distal end, said body of said female contact being transversely secured in a circuit panel, said distal end of said female contact including a contact location adapted for conductively engaging a mating male pin inserted at said proximal end, and electrically insulated from said proximal end and said body by an insulating member, so as to create an interspace region about the male pin between the proximal and distal ends and along the body of the female contact, said body of said female contact and said male pin being parallel in the intersect region and proximal to each other and magnetically coupled so as to provide a region of magnetic cancellation for a first magnetic field of a first orientation generated by a signal propagating in the male pin in a first direction and a second magnetic field of a second orientation generated by the signal propagating through the female contact in a second direction, said female contact being electrically coupled to a conductor on said circuit panel at the proximal end of the female contact.

36. The female contact of claim 35 wherein the body is of a length less than the circuit panel thickness.

37. The female contact of claim 35 wherein the body is of a length greater than the circuit panel thickness.

38. The female contact of claim 35 further comprising a chamber for housing said female contact such that said body and said distal end are enclosed by said chamber, said female contact being electrically insulated from said chamber housing.

39. The female contact of claim 35 wherein the female contact body is secured in a circuit panel aperture formed in the circuit panel.

40. The connector of claim 39 wherein the female contact is press-fit in the circuit panel aperture.

41. The connector of claim 39 wherein the female contact is soldered in the circuit panel aperture.

42. The connector of claim 35 wherein the circuit panel is selected from the group of panel types consisting of a rigid panel, a flexible panel, and a rigid-flex panel.

43. The connector of claim 35 further comprising electronics coupled to and mounted proximal to said female contact on said circuit panel.

* * * * *

UNITED STATES PATENT AND TRADEMARK OFFICE

CERTIFICATE OF CORRECTION

PATENT NO. : 6,276,945 B1

APPLICATION NO. : 09/269451
DATED : August 21, 2001
INVENTOR(S) : C. Michael Hayward et al.

It is certified that error appears in the above-identified patent and that said Letters Patent is hereby corrected as shown below:

Column 13, line 65, delete “formula” and insert --from a --.

Column 14, line 29, after “member,” delete “in the intersect region” and insert --so as to create an interspace region about the male pin between the first and second ends and along the body of the female contact,--.

Column 14, line 30, after “parallel,” delete “so as to create an interspace region about the male pin between the first and second ends and along the body of the female contact,” and insert --in the interspace region--.

Column 14, line 65, delete “intersect” and insert --interspace --.

Signed and Sealed this

Twenty-first Day of August, 2007

JON W. DUDAS
*Director of the United States Patent and Trademark Office*